(12) United States Patent  
Barr et al.

(10) Patent No.: US 9,269,730 B2
(45) Date of Patent: Feb. 23, 2016

(54) IMAGING SYSTEMS WITH BACKSIDE ISOLATION TRENCHES

(71) Applicant: Semiconductor Components Industries, LLC, Phoenix, AZ (US)

(72) Inventors: Peter Rupert Barabash Barr, Morgan Hill, CA (US); Aaron Kenneth Belsher, Boise, ID (US); Giovanni DeAmicis, L'Aquila (IT)

(73) Assignee: Semiconductor Components Industries, LLC, Phoenix, AZ (US)

( * ) Notice: Subject to any disclaimer, the term of this patent is extended or adjusted under 35 U.S.C. 154(b) by 280 days.

(21) Appl. No.: 13/763,249

(22) Filed: Feb. 8, 2013

(65) Prior Publication Data

US 2013/0206962 A1 Aug. 15, 2013

Related U.S. Application Data

(60) Provisional application No. 61/597,084, filed on Feb. 9, 2012.

(51) Int. Cl.
*H01L 27/00* (2006.01)
*H01L 27/146* (2006.01)
*H01L 31/02* (2006.01)

(52) U.S. Cl.
CPC .... *H01L 27/14601* (2013.01); *H01L 27/14632* (2013.01); *H01L 27/14687* (2013.01); *H01L 31/02002* (2013.01); *H01L 27/1464* (2013.01)

(58) Field of Classification Search
CPC .......... H01L 29/76; H01L 29/00; H01L 29/94
USPC ........................................ 257/506, 501, 548
See application file for complete search history.

(56) References Cited

U.S. PATENT DOCUMENTS

| | | | | |
|---|---|---|---|---|
| 6,057,588 | A * | 5/2000 | Yamazaki | 257/506 |
| 7,598,136 | B2 * | 10/2009 | Park et al. | 438/201 |
| 2011/0049336 | A1 * | 3/2011 | Matsunuma | 250/214.1 |

* cited by examiner

*Primary Examiner* — Tony Ko
(74) *Attorney, Agent, or Firm* — Treyz Law Group, P.C.; Kendall P. Woodruff (57) ABSTRACT

An image sensor such as a backside illumination image sensor may be provided with analog circuitry, digital circuitry, and an image pixel array on a semiconductor substrate. Trench isolation structures may separate the analog circuitry from the digital circuitry on the substrate. The trench isolation structures may be formed from dielectric-filled trenches in the substrate that isolate the portion of the substrate having the analog circuitry from the portion of the substrate having the digital circuitry. The trench isolation structures may prevent digital circuit operations such as switching operations from negatively affecting the performance of the analog circuitry. Additional trench isolation structures may be interposed between portions of the substrate on which bond pads are formed and other portions of the substrate to prevent capacitive coupling between the bond pad structures and the substrate, thereby enhancing the high frequency operations of the image sensor.

5 Claims, 6 Drawing Sheets

IMAGING SYSTEMS WITH BACKSIDE ISOLATION TRENCHES

This application claims the benefit of provisional patent application No. 61/597,084, filed Feb. 9, 2012, which is hereby incorporated by reference herein in its entirety.

BACKGROUND

This relates generally to imaging devices, and more particularly, to imaging devices with trench isolated circuitry.

Modern electronic devices such a cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical signals. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. In an image sensor having frontside illuminated image pixels, a dielectric stack is formed on the front surface of the substrate directly on top of the photodiodes. The dielectric stack includes metal routing lines and metal vias formed in dielectric material. Image light passes through the dielectric stack to the photodiodes. In an image sensor having backside illuminated image pixels, the photodiodes are formed on a thinned semiconductor substrate and receive image light through the backside of the semiconductor substrate so that the light does not pass through the dielectric stack.

Both frontside and backside illuminated image sensors often include an image pixel array formed on a common semiconductor integrated circuit die with control circuitry such as analog control circuitry and digital control circuitry (sometimes referred to as a system-on-chip or SOC arrangement). In a frontside illuminated configuration, deep well isolation structures can be used to electrically isolate the analog circuitry from the control circuitry. However, in a backside illuminated configuration, the relatively thin semiconductor substrate can increase the capacitive coupling between deep well isolation structures as well as increasing the capacitive coupling between bond pads on the chip and the active substrate. If care is not taken, these increased capacitive couplings can respectively reduce the effectiveness of deep well isolation structures and can negatively impact performance of the chip in high speed applications.

It would therefore be desirable to be able to provide improved semiconductor circuits such as image sensors with improved noise isolation and high frequency performance.

DETAILED DESCRIPTION

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors such as system-on-chip backside illumination image sensors may be provided with trench isolation structures. The trench isolation structures may electrically isolate digital control circuitry from analog circuitry and/or isolate bond pads on the chip from other portions of the chip.

Processing steps that are used to form backside-illuminated image sensors such as backside-illuminated CMOS image sensors (BSI-CIS) include process steps that are unique to the BSI-CIS structure. For example, pad connections to embedded active circuits may be made with two consecutive etch steps. The first step is to etch an active silicon layer from an outer surface through to an underlying intermetal dielectric (IMD) structure. This step is followed by a dielectric etch to expose and make electrical contact to pads formed in this IMD layer.

Embodiments disclosed herein introduce a form of circuit isolation that reduces process complexity at no additional cost. In particular, circuit isolation using trench isolation regions in BSI-CIS image sensors may help improve noise isolation in SOC designs, and may help decouple pad capacitance for high speed applications. Trench isolation regions formed with the use of additional design patterns in the photomask for the silicon etch enables the same etch step to be used to form islands of silicon, physically isolating adjacent circuit blocks. No additional masking steps are required, and the process flow remains unchanged. Coupling capacitance associated with junction isolation may be reduced or eliminated, to provide improved performance with a clear cost advantage.

The drive for speed and higher frequency operation requires the design of special bond pads. In the case of BSI, the pad structures are in closer proximity to the active substrate than conventional logic devices. If care is not taken, this can result in higher coupling capacitance to ground, and a reduced high frequency performance. By surrounding the pad with isolation trenches, the coupling capacitance can be reduced or eliminated.

Figure 1:
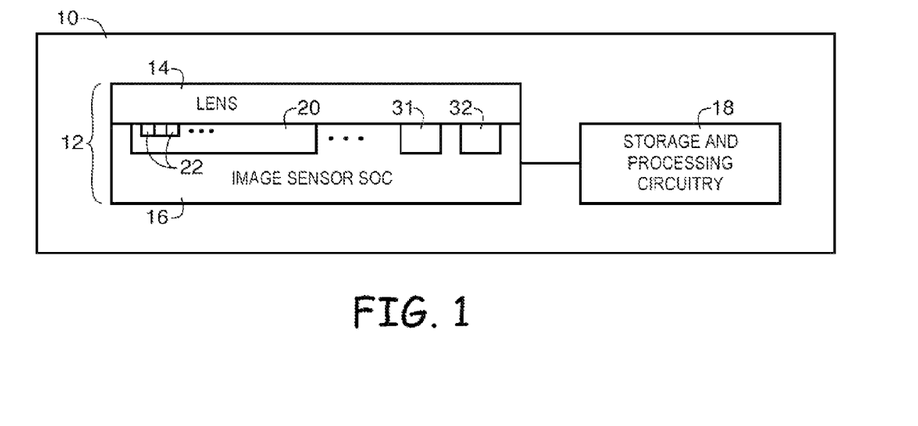
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 15. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Figure 2:
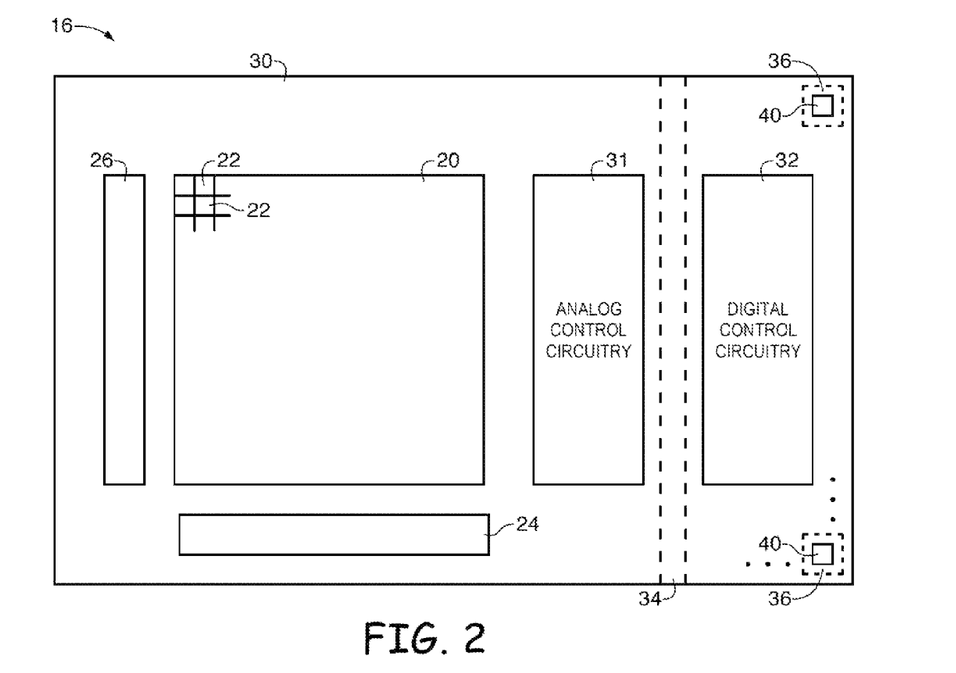
FIG. 2 is a top view of an illustrative image sensor system-on-chip with a pixel array and associated control circuitry formed on a common integrated circuit die in accordance with an embodiment of the present invention.

FIG. 2 is a top view of an illustrative image sensor that is implemented as an image sensor system-on-chip having an image pixel array and analog and digital control circuitry on a common integrated circuit die in accordance with an embodiment of the present invention. As shown in FIG. 2, an image sensor such as image sensor 16 may include an array of pixels such as pixel array 20 having a multiple image pixels 22 formed on a substrate 30 (e.g., a silicon image sensor integrated circuit die). Image sensor 16 may include control circuitry such as column control circuitry 24 and/or row control circuitry 26 for operating pixels 22 during image capture operations. Circuitry 24 and 26 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

If desired, image sensor 16 may include additional circuitry such as analog control circuitry 31 and/or digital control circuitry 32 formed on substrate 30. Circuitry 31 and 32 may be formed entirely on substrate 30 or may be formed, in part, or entirely on an additional integrated circuit die. Row control circuitry 26 and column control circuitry 24 may form a portion of analog circuitry 31 or may be formed separately from analog control circuitry 31.

Image sensor 16 may include isolation structures such as trench isolation structures 34 and 36. Trench isolation structure 34 may be formed from etched trenches in the image sensor substrate. Trench isolation structure 34 may electrically isolate analog circuitry 31 from digital control circuitry 32. In this way, circuit operations such as digital switching operations performed by digital control circuitry 32 may be prevented from affecting signal processing and other operations of analog circuitry 31.

Trench isolation structures 36 may extend around bond pads 40 (e.g., conductive contacts for coupling image sensor 16 to additional circuitry such as processing circuitry 18 of FIG. 1).

Figure 3:
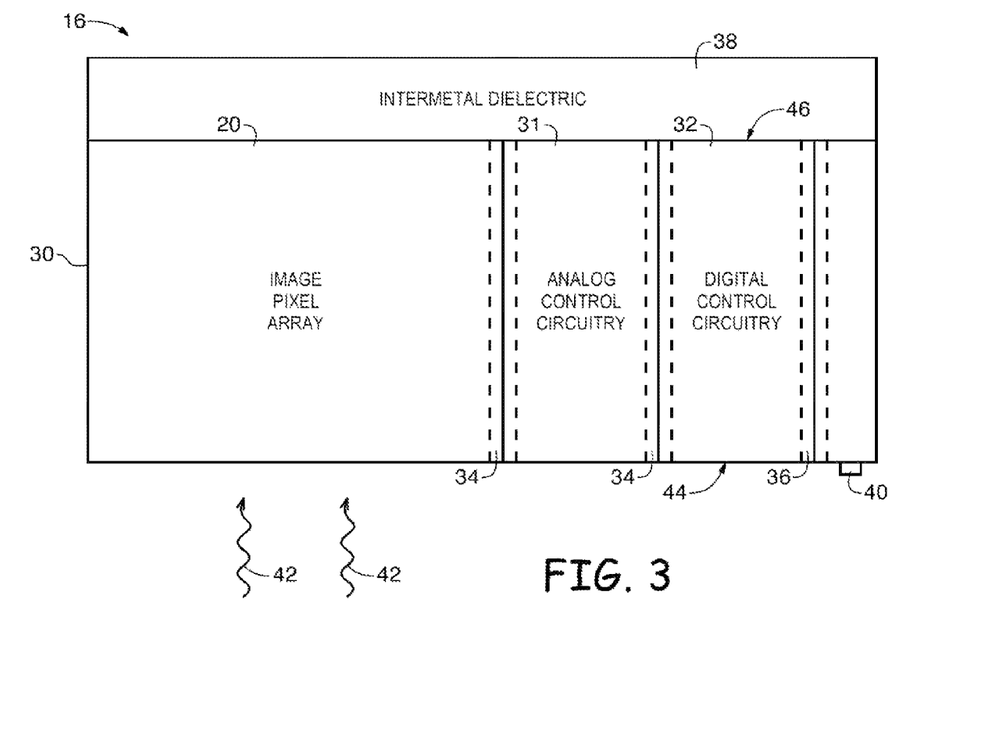
FIG. 3 is a cross-sectional view of an illustrative image sensor system-on-chip with a pixel array and associated control circuitry formed on a common integrated circuit die in accordance with an embodiment of the present invention.

FIG. 3 is a cross-sectional view of image sensor 16 of FIG. 2 showing how image sensor 16 may be formed from an image sensor substrate such as substrate 30 (e.g., a silicon substrate) that is coupled to a circuit stack such as intermetal dielectric (IMD) layers 38. Image pixel array 20, analog control circuitry 31, and digital control circuitry 32 may be distributed laterally across substrate 30. Layers 38 may include one or more layers of conductive interconnect structures that carry signals between image pixel array 20, analog circuitry 31, digital control circuitry 32 and bond pad 40. Image pixel array 20 may receive image light 42 through surface 44.

As shown in FIG. 3, trench isolation structures such as structures 34 may extend from outer surface 44 of substrate 30 through to interface 46 between substrate 30 and IMD layers 38 to electrically isolate analog circuitry 31 from digital circuitry 32. An additional trench isolation structure that extends from outer surface 44 of substrate 30 through to interface 46 between substrate 30 and IMD layers 38 such as isolation structure 36 may electrically isolate bond pads such as bond pad 40 from other portions of substrate 30.

Figure 4:
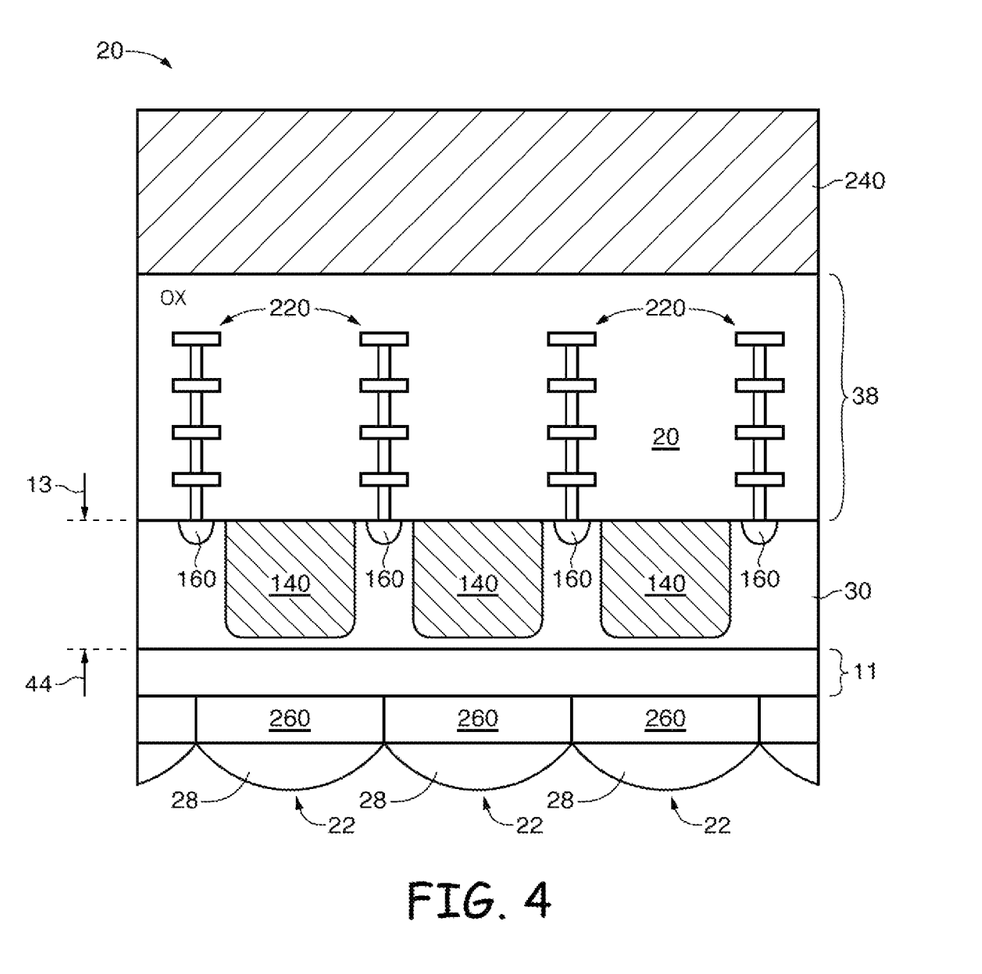
FIG. 4 is a cross-sectional side view of an illustrative portion of a pixel array of the type shown in FIGS. 2 and 3 in accordance with an embodiment of the present invention.

FIG. 4 is a cross-sectional side view of a portion of image sensor SOC 16 in which an array of backside illumination image sensor pixels is formed. Each pixel 22 has a photodiode 140 formed on a front side of substrate 30 (e.g., an active p-type epitaxial silicon substrate). Each pixel 22 also has an associated floating diffusion region 160 formed in the front side of substrate 30. As shown in FIG. 4, intermetal dielectric stack 38 may be formed on front surface 13 of substrate 30. Dielectric stack 38 may include metal interconnect structures 220 formed in dielectric material (e.g., silicon dioxide, glass, or other suitable dielectric). Dielectric stack 38 may be boned to a silicon carrier such as silicon carrier board 240.

An array of color filter elements 260 may be formed on back surface 44 of substrate 30. A respective microlens 28 may be formed over each color filter pixel element 260. Light can enter from the back side of the image sensor pixels 22 through microlenses 28. The incoming light may be absorbed and detected by photodiode 140.

Figure 5:
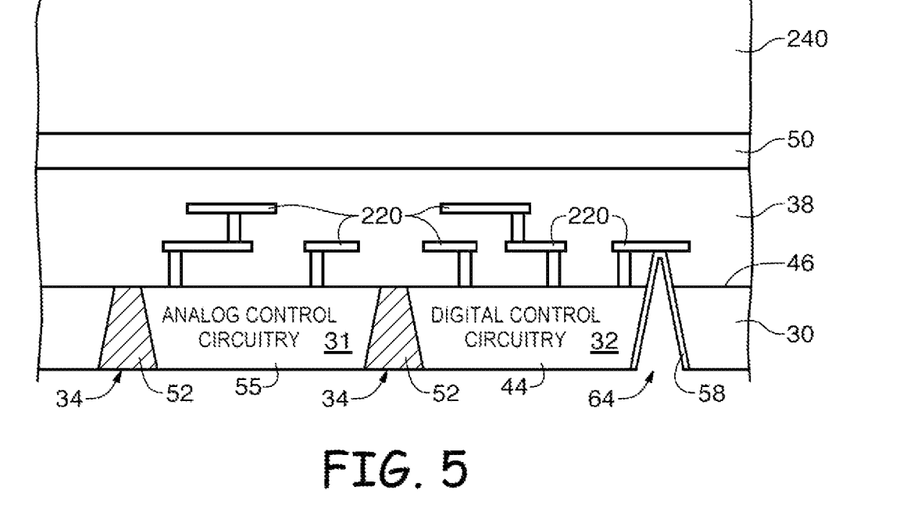
FIG. 5 is a cross-sectional side view of an illustrative portion of an image sensor having analog and digital control circuitry of the type shown in FIGS. 2 and 3 that are separated by trench isolation regions in accordance with an embodiment of the present invention.

FIG. 5 is a cross-sectional side view of a portion of image sensor SOC 16 in which analog and digital circuitry that are electrically isolated using trench isolation structures are formed. As shown in FIG. 5, substrate 30 may include multiple isolation trenches such as trench isolation structures 34. Substrate 30 may also include conductive interconnect structures such as via 64. Trench isolation structures 34 may be formed by etching openings in substrate 30 from surface 44 through to interface 46 between IMD 38 and substrate 30. If desired, etched openings 34 may be coated or filled with dielectric material 52. Vias such as via 64 may be formed by etching openings in substrate 30 from surface 44 through to interface 46 between IMD 38 and substrate 30, performing a second etch of openings that extend into IMD 38 through to one of interconnects 220, and coating the surfaces of the etched openings with conductive material (e.g., copper), thereby electrically coupling interconnects 220 to surface 44.

Openings in substrate 30 that are used to form isolation structures 34 and vias 64 may be formed during a common silicon etch step. In this way, analog circuitry 31 (e.g., transistors, capacitors, amplifiers, storage, etc.) may be formed on an "island" 55 of silicon that is electrically isolated from digital control circuitry 32 without adding any additional processing steps to form the isolation structures.

If desired, additional material may be formed in isolation structures 34 and vias 64. For example, a coating such as a dielectric layer or an antireflective coating layer (not shown) may be formed on surface 44 and on interior surfaces of trenches formed in substrate 30 prior to forming dielectric material 52 and conductive material 58 in the trenches. As shown in FIG. 5, silicon carrier 240 may be attached to IMD 38 using a bonding layer such as bond oxide layer 50. Additional circuitry may be coupled to interconnects 220 of IMD 38 using vias such as via 64 as shown in FIG. 6.

Figure 6:
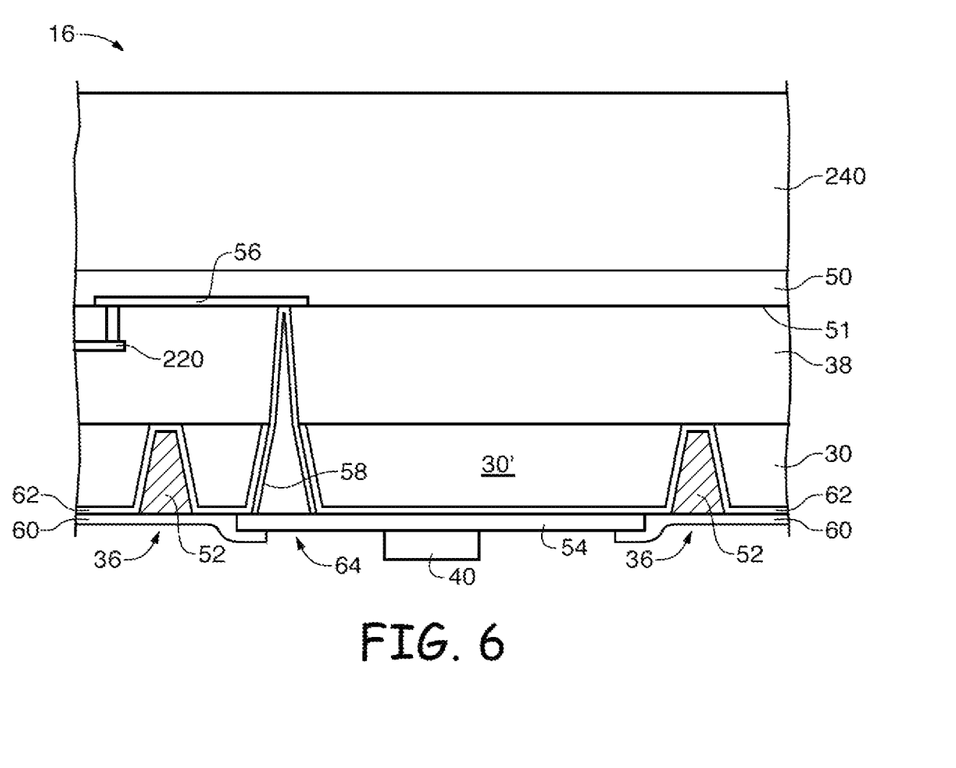
FIG. 6 is a cross-sectional side view of an illustrative portion of an image sensor having a bond pad of the type shown in FIGS. 2 and 3 that is isolated by trench isolation regions in accordance with an embodiment of the present invention.

FIG. 6 is a cross-sectional side view of a portion of image sensor SOC 16 in which a bond pad is formed that is electrically isolated from other portions of the image sensor using trench isolation structures 36. As shown in FIG. 6, interconnects 220 may be coupled to a frontside conductive structure such as conductive structure 56 on interior surface 51 of IMD 38. Conductive structure 56 may be interposed between a portion of IMD 38 and bond oxide layer 50. Conductive structures 56 may route signals from interconnects 220 to a conductive via 64.

Conductive via 64 of FIG. 6 maybe formed from a trench that has been etched in a two-step etching process through substrate 30 (first etch step) and through IMD 38 (second etch step) and coated (or filled) will conductive material 58 as described above in connection with FIG. 5. Conductive via 64 may also pass through additional layers such as layer 62. Layer 62 may be formed from an antireflective coating layer or any other suitable dielectric layer. Via 64 may be coupled between conductive structure 56 on surface 51 of layer 38 and an additional conductive structure such as conductive structure 54 on a backside of image sensor 16.

Conductive structure 54 may be formed over antireflective coating 62. A conductive contact pad such as bond pad 40 may be formed on conductive structure 54. In this way, bond pad 40 may be used to route electrical signals from interconnects 220 (and image pixel array 20) to additional circuitry such as processing circuitry 18 of FIG. 1 (e.g., by coupling processing circuitry 18 to bond pad 40).

As shown in FIG. 6, bond pad 40 and associated conductive via 64 may be formed in a portion such as portion 30' of substrate 30 that is electrically isolated from other portions of substrate 30 by trench isolation structures 36. In this way, capacitive coupling between bond pad 40 and other portions of substrate 30 may be reduced or eliminated, thereby improving the high-speed performance of image sensor 16.

As shown in FIG. 6, trench isolation structures 36 may be formed on opposing sides of bond pad 40 in substrate 30. If desired, trench isolation structures 36 may surround each bond pad 40 (as shown in the top view of FIG. 1). However, this is merely illustrative. Trench isolation structures may be formed along one side, along two sides, along three sides, along four sides or in any suitable configuration surrounding or partially surrounding each bond pad 40 that isolates the bond pad from capacitive couplings to substrate 30.

As shown in FIG. 6, portions of layer 62 may be formed within trench isolation structures 36 and via 64. Portions of layer 62 that are formed within trench isolation structures 36 may be interposed between dielectric material 52 in the trench and substrate 30 and between dielectric material 52 in the trench and IMD 38. Portions of layer 62 that are formed within vias such as via 64 may be interposed between conductive material 58 and substrate 30. If desired, a layer of passivation material such as passivation layer 60 (e.g., a layer of silicon dioxide) may be formed on image sensor 16 that covers trench isolation structures 36, portions of layer 62, and portions of conductive structure 54.

Figure 7:
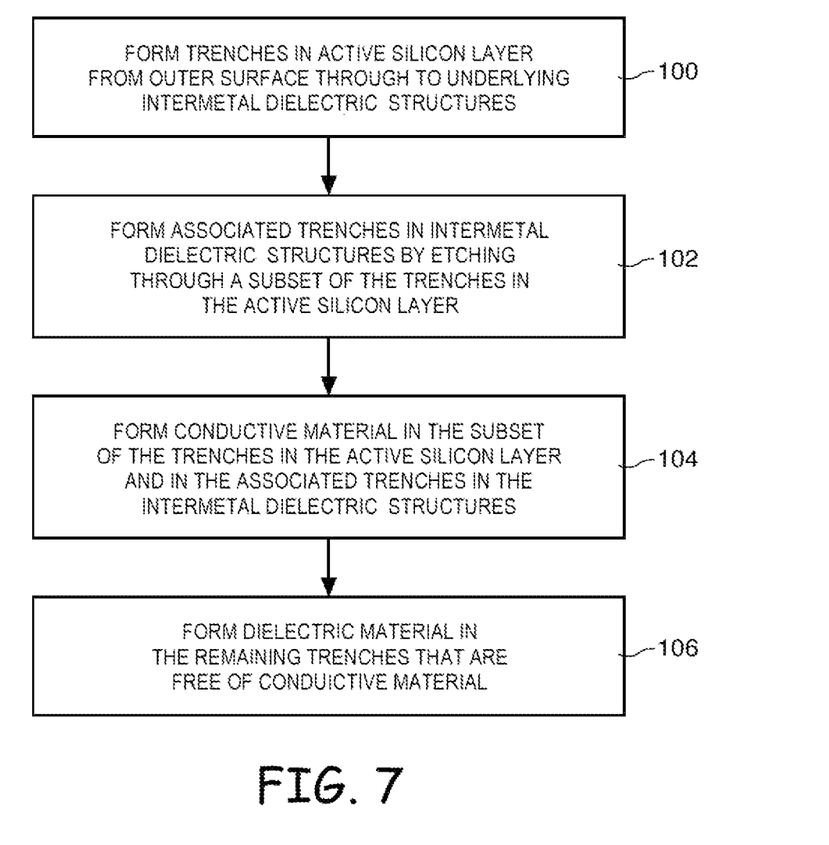
FIG. 7 is a flow chart of illustrative steps involved in forming trench isolation regions for a backside illumination image sensor in accordance with an embodiment of the present invention.

FIG. 7 is a flow chart of illustrative steps involved in forming trench isolation structures in a backside illuminated image sensor system-on-chip of the type shown in FIG. 5 and/or FIG. 6.

At step 100, openings such as trenches may be formed in a substrate such as an active silicon layer of an image sensor from an outer (backside) surface of the substrate to an underlying intermetal dielectric structure. Trenches may be formed between analog circuitry and digital circuitry on the substrate. Trenches may be formed that surround or partially surround bond pads formed on a backside of the substrate.

At step 102, additional trenches associated with some of the etched trenches in the active silicon layer may be etched into the intermetal dielectric structures by etching the intermetal dielectric through a subset of the etched trenches in the active silicon layer. The additional trenches may pass partially or completely through the intermetal dielectric structures. If desired, additional material such as an antireflective coating may also be formed in the subset of trenches prior to etching the additional trenches.

At step 104, conductive material may be formed in the subset of trenches in the active silicon layer and in the associated trenches in the intermetal dielectric structures. The conductive material may be coated onto surfaces of the trenches or may substantially fill the trenches. A portion of the conductive material may be formed in contact with metal interconnect structures in the intermetal dielectric layer or on an interior surface of the intermetal dielectric layer.

At step 106, dielectric material may be formed in the remaining trenches in the substrate that are free of conductive material. If desired, additional material such as an antireflective coating may also be formed in the subset of trenches prior to forming the dielectric material in the remaining trenches. If desired, step 106 may be formed prior to step 102.

Figure 8:
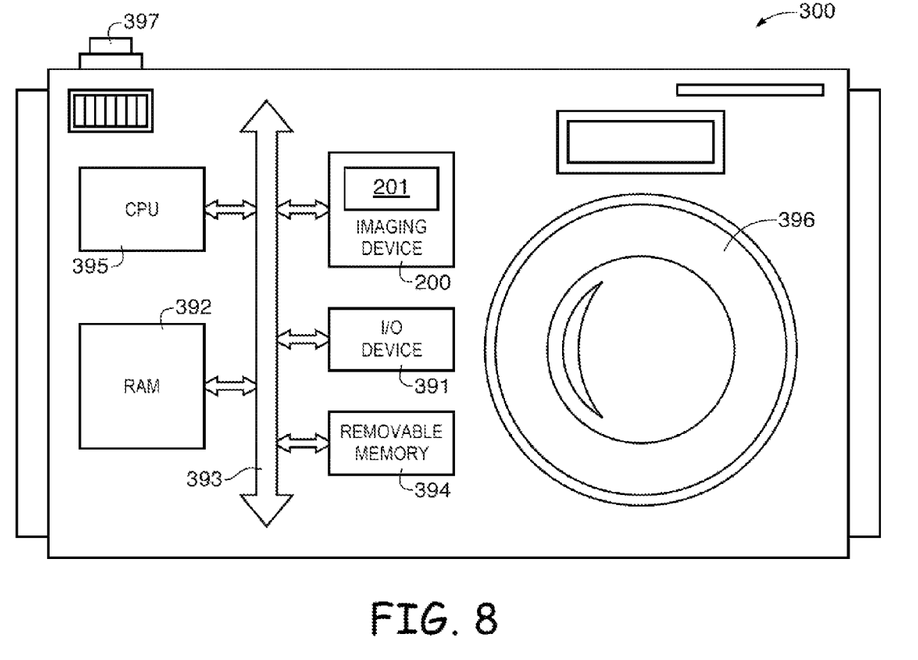
FIG. 8 is a block diagram of an imager employing the embodiments of FIGS. 1-7 in accordance with an embodiment of the present invention.

FIG. 8 shows in simplified form a typical processor system 300, such as a digital camera, which includes an imaging device 200. Imaging device 200 may include a pixel array 201 of the type shown in FIG. 1 (e.g., pixel array 201 may be pixel array 20 of FIG. 1) formed on an image sensor SOC with trench isolation structures as described above. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensor system-on-chips with trench isolation structures. An image sensor SOC with trench isolation structures may be used in an imaging system such as an electronic device.

Trench isolation structures may be formed in a substrate for the image sensor SOC. The trench isolation structures may be interposed between analog circuitry on the substrate and digital circuitry on the substrate. Additional trench isolation structures may be interposed between a portion of the substrate on which a bond pad is formed and additional portions of the substrate. The additional trench isolation structures may surround or partially surround each of a plurality of bond pads on the substrate.

Trenches for the trench isolation structures may be formed during a common processing (etching) step with trenches for conductive interconnect structures such as conductive vias that pass through the substrate. The trenches for the conductive interconnect structures may be portions of trenches that pass through the substrate and at least a portion of an intermetal dielectric stack adjacent to the substrate.

The foregoing is merely illustrative of the principles of this invention which can be practiced in other embodiments.

What is claimed is:

1. An image sensor, comprising:
   a substrate;
   digital circuitry on a first portion of the substrate;
   analog circuitry on a second portion of the substrate;
   an array of image pixels on a third portion of the substrate;
   an intermetal dielectric stack attached to the substrate; and
   at least one trench isolation structure in the substrate that electrically isolates the analog circuitry from the digital circuitry, wherein the at least one trench isolation structure is interposed between the first portion of the substrate and the second portion of the substrate, and wherein the at least one trench isolation structure comprises dielectric material formed in a trench in the substrate.

2. The image sensor defined in claim 1 wherein the trench in the substrate extends from a backside surface of the substrate to an interface between the substrate and the intermetal dielectric stack.

3. The image sensor defined in claim 2 wherein the array of image pixels comprises an array of backside illuminated image pixels that receive light through the backside surface of the substrate.

4. The image sensor defined in claim 1, further comprising a conductive via, wherein the conductive via is formed in an additional trench that extends through the substrate and through at least a portion of the intermetal dielectric stack.

5. The image sensor defined in claim 4 wherein the trench in the substrate and a portion of the additional trench have been formed in a common etch process.

\* \* \* \* \*